(12) United States Patent
Ivanov et al.

(10) Patent No.: US 7,135,692 B2
(45) Date of Patent: Nov. 14, 2006

(54) LITHOGRAPHIC APPARATUS, ILLUMINATION SYSTEM AND METHOD FOR PROVIDING A PROJECTION BEAM OF EUV RADIATION

(75) Inventors: Vladimir Vitalevitch Ivanov, Moscow (RU); Vadim Yevgenyevich Banine, Helmond (NL); Konstantin Nikolaevitch Koshelev, Moscow (RU)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/727,035

(22) Filed: Dec. 4, 2003

(65) Prior Publication Data

US 2005/0121624 A1 Jun. 9, 2005

(51) Int. Cl.
*A61N 5/00* (2006.01)

(52) U.S. Cl. .............................. 250/492.2; 250/442.22; 250/504 R; 250/492.1; 355/76

(58) Field of Classification Search ............. 250/492.2, 250/504 R, 492.1; 355/76
See application file for complete search history.

(56) References Cited

U.S. PATENT DOCUMENTS

| | | | |
|---|---|---|---|
| 6,232,613 B1* | 5/2001 | Silfvast et al. .......... 250/504 R |
| 6,285,737 B1* | 9/2001 | Sweatt et al. ................. 378/85 |
| 6,590,959 B1* | 7/2003 | Kandaka et al. ............ 378/119 |
| 6,614,505 B1* | 9/2003 | Koster et al. ................. 355/30 |
| 6,753,941 B1* | 6/2004 | Visser .......................... 355/30 |
| 6,781,673 B1* | 8/2004 | Moors et al. ................. 355/76 |
| 6,881,971 B1* | 4/2005 | Ahmad ................... 250/504 R |
| 6,888,297 B1* | 5/2005 | Klebanoff et al. .......... 313/356 |
| 6,972,421 B1* | 12/2005 | Melnychuk et al. ..... 250/504 R |
| 2002/0168049 A1* | 11/2002 | Schriever et al. ........... 378/119 |
| 2003/0095623 A1* | 5/2003 | Singer et al. ................. 378/34 |
| 2003/0190012 A1 | 10/2003 | Ahmad |
| 2004/0032574 A1* | 2/2004 | Koster et al. ................. 355/30 |
| 2004/0130694 A1* | 7/2004 | Kurt et al. .................... 355/69 |

FOREIGN PATENT DOCUMENTS

| | | |
|---|---|---|
| EP | 0 858 249 A1 | 8/1998 |
| EP | 1 223 468 A1 | 7/2002 |

OTHER PUBLICATIONS

European Search Report for Application No. 04078219.5, dated Apr. 8, 2005.

* cited by examiner

*Primary Examiner*—Nikita Wells
*Assistant Examiner*—Anthony Quash
(74) *Attorney, Agent, or Firm*—Pillsbury Winthrop Shaw Pittman LLP

(57) ABSTRACT

A lithographic apparatus is disclosed. The lithographic apparatus includes an illumination system that provides a beam of radiation, and a support structure that supports a patterning structure. The patterning structure is configured to impart the beam of radiation with a pattern in its cross-section. The apparatus also includes a substrate support that supports a substrate, and a projection system that projects the patterned beam onto a target portion of the substrate. The illumination system includes a radiation-production system that produces extreme ultra-violet radiation, and a radiation-collection system that collects extreme ultra-violet radiation. Particles that are produced as a by-product of extreme ultra-violet radiation production move substantially in a particle-movement direction. The radiation-collection system is arranged to collect extreme ultra-violet radiation which radiates in a collection-direction, which is substantially different from the particle-movement direction.

13 Claims, 4 Drawing Sheets

LITHOGRAPHIC APPARATUS, ILLUMINATION SYSTEM AND METHOD FOR PROVIDING A PROJECTION BEAM OF EUV RADIATION

BACKGROUND OF THE INVENTION

1. Field of the Invention

The present invention relates to a lithographic apparatus, an illumination system, and a method for providing a projection beam of EUV radiation.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (comprising part of one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Lithographic apparatus include, for example, an illumination system for providing a projection beam of radiation. In an extreme ultra-violet (EUV) system, the illumination system typically includes a radiation-production system for producing extreme ultra-violet radiation (EUV), and a radiation-collection system for collection of the EUV produced by the radiation-production system.

Examples of radiation-production systems includes laser produced plasma sources and discharge plasma sources. A laser produced plasma source usually comprises an object, which may also be a gas, that is hit by a laser. This causes a secondary emission, e.g. EUV light, as well as the production of undesired particles, referred to as particles or debris particles.

During use of an illumination system, the particles that are produced as a by-product of the production of the EUV radiation typically enter the radiation-collection system, which causes pollution, or contamination. If the particles have a high velocity, the particles may cause damage to the radiation-collection system. It is possible that other parts of the illumination system that are "downstream," with respect to the radiation-collection system, may suffer from the presence and/or impact of these high velocity particles.

BRIEF SUMMARY OF THE INVENTION

In this specification debris particles are understood to encompass ions, as well as neutrals (both fast and slow), in sizes ranging form atomic or ionic dimensions up to and including micron-sized particles.

It is an aspect of embodiments of the present invention to provide a lithographic apparatus which is less affected by the problems caused by these particles.

Embodiments are, in particular, related to a lithographic apparatus comprising an illumination system for providing a projection beam of radiation and to such an illumination system. In general, such an illumination system comprises a radiation-production system for producing extreme ultra-violet (EUV) radiation and, as a by-product, particles which move substantially into a particle-movement direction. The illumination system also comprises a radiation-collection system for collecting extreme ultra-violet (EUV) radiation.

According to an aspect of embodiments of the invention, there is provided a lithographic apparatus comprising an illumination system for providing a projection beam of radiation, a support structure for supporting a patterning structure, the patterning structure serving to impart the projection beam with a pattern in its cross-section, a substrate table for holding a substrate, and a projection system for projecting the patterned beam onto a target portion of the substrate. The illumination system comprises a radiation-production system for producing extreme ultra-violet (EUV) radiation, and a radiation-collection system for collecting extreme ultra-violet (EUV) radiation. The radiation-production system, as a by-product, produces particles which move substantially into a particle-movement direction. The radiation-collection system is substantially arranged to collect extreme ultra-violet (EUV) radiation, which radiates substantially into a collection-direction. The collection-direction is substantially different from-the particle-movement direction.

According to another aspect of embodiments of the invention, there is provided a lithographic apparatus that includes an illumination system that provides a beam of radiation, and a support structure that supports a patterning structure. The patterning structure is configured to impart the beam of radiation with a pattern in its cross-section. The apparatus also includes a substrate support that supports a substrate, and a projection system that projects the patterned beam onto a target portion of the substrate. The illumination system includes a radiation-production system that produces extreme ultra-violet radiation, and a radiation-collection system that collects extreme ultra-violet radiation. Particles that are produced as a by-product of extreme ultra-violet radiation production move substantially in a particle-movement direction. The radiation-collection system is arranged to collect extreme ultra-violet radiation which radiates in a collection-direction, which is substantially different from the particle-movement direction.

As the radiation-collection system of a lithographic apparatus, according to embodiments of the invention, is substantially arranged to collect EUV radiation that radiates into a direction different from the particle-movement direction, much less particles, if any at all, will enter the radiation-collection system when compared to the number of particles entering the radiation collection system in a prior art lithographic apparatus. Hence, pollution and/or, if the particles have a high velocity, damage of the radiation-collection system is reduced. Also, other parts of the illumination system that are "downstream," with respect to the radiation-collection system, will suffer much less, if at all, from the presence and/or impact of the high velocity particles, as compared to a known illumination system.

In a lithographic apparatus according to an embodiment of the invention, the radiation-production system may comprise two electrodes oppositely chargeable, wherein an electric field, which can be generated between the electrodes, substantially follows an axial direction of the radiation-production system. This ensures that a path in the particle-movement direction that will be substantially followed by charged particles produced during production of the EUV will be well defined. In such an embodiment, generally magnetic-hydrodynamic forces are produced during a high current flow, further ensuring that particles follow the particle-movement direction along a well-defined path.

Consequently, a direction which differs from the particle-movement direction will also be well-defined, leading to minimal collection of particles by the radiation-collection system. Charged particles may drag neutral particles along or may, if their kinetic energy is high enough, ionize neutral particles. These ionized particles will then also follow the electric field generated by the two oppositely charged electrodes. The directional movement of ionized or neutral particles of atomic or molecular dimensions comprises a flow which can further drag along nano-and micron sized particles, not unlike friction at a macroscopic level. With this even better defined particle-movement direction, the radiation-collection direction, being different from the particle-movement direction, is also very well defined and easily usable for collecting radiation without collecting as many particles as in known systems in the art.

In an embodiment of a lithographic apparatus according to the invention, the collection-direction is a radial direction of the radiation-production system. This dramatically reduces the collection of particles in the radiation-collection system as at least most, if not all, of the charged particles will move into the axial direction instead of into the radial direction.

It is possible that in an embodiment, at least one of the two electrodes is substantially a ring-shaped electrode, such that the axial direction of each ring-shaped electrode substantially coincides with the axial direction of the radiation-production system. This allows for the charged particles to move along the axis through the ring-shaped electrode from where the charged particles can be caught, for instance, by a pump, to avoid re-entering the space between the electrodes.

In an embodiment of a lithographic apparatus according to the invention, the radiation-collection system has an optical axis substantially parallel to the axial direction of the radiation-production system. This allows for an optimal collection of the radiation. The radiation-collection system may, in this case, be substantially ring-shaped with a mirror surface at the inner wall. The mirror surface will be inclined such that the radiation is reflected towards the axial direction.

It is possible that the radiation-collection system may also include an optical system for aiding in providing the projection beam of radiation.

According to a further aspect of embodiments of the invention, an illumination system for providing a projection beam of radiation is provided. The illumination system comprising a radiation-production system for producing extreme ultra-violet (EUV) radiation, and a radiation-collection system for collecting extreme ultra-violet (EUV) radiation. The radiation-production system, as a by-product, produces particles which move substantially into a particle-movement direction. The radiation-collection system is substantially arranged to collect extreme ultra-violet (EUV) radiation which radiates substantially into a collection-direction. The collection-direction is substantially different from the particle-movement direction.

According to a further aspect of embodiments of the invention, a method for providing a projection beam of radiation is provided. The method comprises producing extreme ultra-violet (EUV) radiation, and substantially collecting extreme ultra-violet (EUV) radiation which radiates substantially into a collection direction. As a by-product of the production of extreme ultra-violet radiation, particles are produced, which move substantially into a particle-movement direction. The collection direction is substantially different from the particle-movement direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass extreme ultra-violet (EUV) radiation (e.g. having a wavelength in the range of 5–20 nm).

The terms "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning structure may be transmissive or reflective. Examples of a patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning means, the support structure may be a frame or table, for example, which may be fixed or movable as needed and which may ensure that the patterning means is at a desired position, for example with respect to the projection system. Any use of the terms "reticle" or "mask" herein may be considered synonymous with the more general term "patterning means."

The term "projection system" used herein should be broadly interpreted as encompassing various types of projection systems, including refractive optical systems, reflective optical systems, and catadioptric optical systems, as appropriate for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines, the additional tables may be used in parallel, or preparatory steps may be carried out on one or more tables, while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
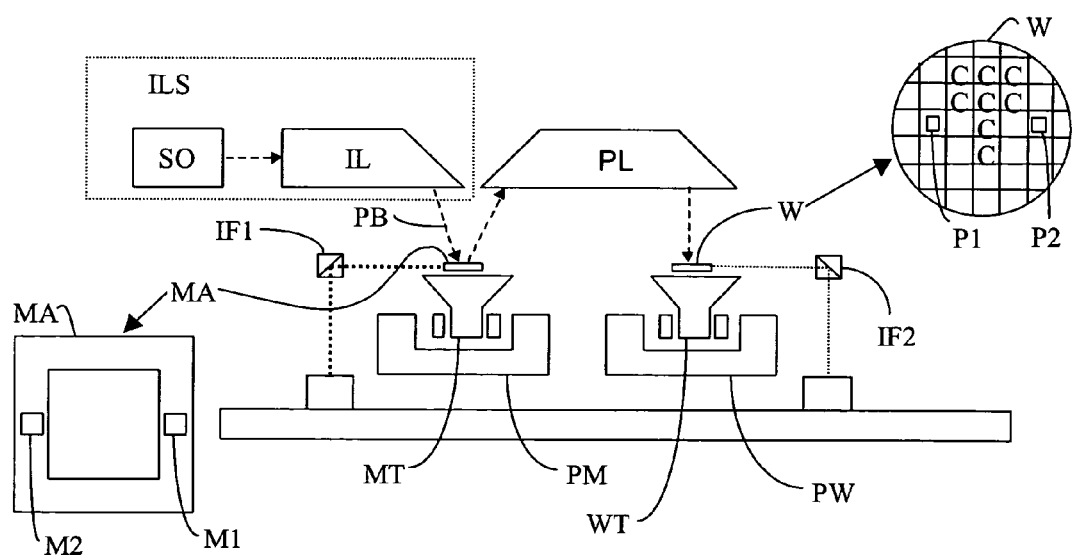
FIG. 1 depicts schematically a lithographic apparatus according to an embodiment of the invention.

FIG. 1 schematically depicts a lithographic apparatus according to a particular embodiment of the invention. The apparatus comprises an illumination system (ILS) comprising an illuminator IL for providing a projection beam PB of radiation (e.g. EUV radiation), a first support structure (e.g. a mask table) MT for supporting a patterning structure (e.g. a mask) MA and connected to a first positioning device PM for accurately positioning the patterning structure with respect to item PL, a substrate table (e.g. a wafer table) WT for holding a substrate (e.g. a resist coated wafer) W and connected to a second positioning device PW for accurately positioning the substrate with respect to item PL, and a projection system (e.g. a reflective projection lens) PL for imaging a pattern imparted to the projection beam PB by patterning means MA onto a target portion C (e.g. comprising one or more dies) of the substrate W. The term "substrate table" as used herein can also be considered or termed as a substrate support. It should be understood that the term substrate support or substrate table broadly refers to a structure that supports, holds, or carries a substrate.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, such as when the source is a plasma discharge source. In such cases, the source may not necessarily be considered to form part of the lithographic apparatus and the radiation beam is generally passed from the source SO to the illuminator IL with the aid of a radiation collector comprising, for example, suitable collecting mirrors and/or a spectral purity filter. In other cases, the source may be an integral part of the apparatus, such as when the source is a mercury lamp. The source SO and the illuminator IL may also be referred to as a radiation system.

The illuminator IL may comprise an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, so as to position different target portions C in the path of the beam PB. Similarly, the first positioning device PM and position sensor IF1 can be used to accurately position the mask MA with respect to the path of the beam PB, such as after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. The mask MA and the substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
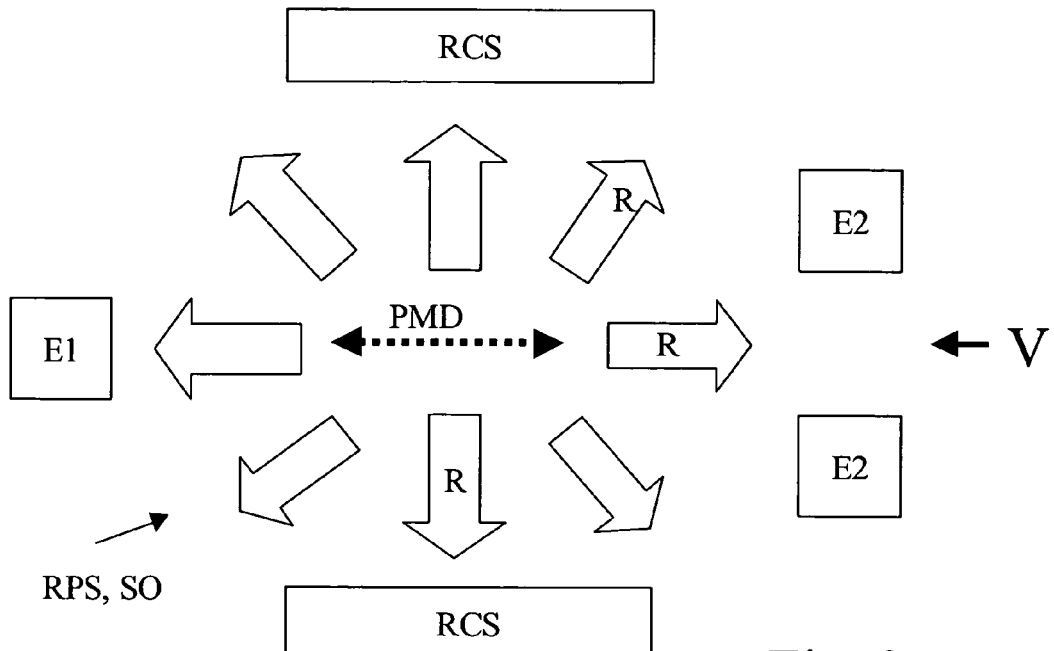
FIG. 2 depicts schematically a radiation-production system and a radiation-collection system according to an embodiment of the invention.

FIG. 2 shows schematically at least a part of an illumination system ILS of a lithographic apparatus according to an embodiment of the invention. The illumination system ILS comprises at least a radiation-production system RPS for producing extreme ultraviolet (EUV) radiation. The radiation is schematically indicated by large arrows R. This radiation-production system RPS, in particular, the radiation source SO, produces as by-product particles which move substantially into a particle-movement direction PMD, schematically indicated by the dotted line and arrows PMD. In this example the radiation-production system RPS may be a plasma discharge source known in itself.

The radiation-production system may comprise two electrodes E1, E2 oppositely chargeable. One or both of the electrodes E1, E2 may be ring shaped. An electric field, which can be generated between the electrodes, substantially follows an axial direction of the radiation-production system. The particle-movement direction PMD coincides with the axial direction of the radiation-production system, as charged particles will follow the electric field lines. Also, magnetic-hydro-dynamic forces may have also been generated, thereby ensuring that the charged particles move along the particle movement direction PMD. The charged particles may "drag along" neutral particles in their movement into the axial direction and these ions, neutral atoms, and molecules may form a flow which can further "drag along" nanosized and/or micron sized particles.

The illumination system may also comprise a radiation-collection system RCS for collecting extreme ultraviolet (EUV) radiation. The radiation-collection system RCS is substantially arranged to collect extreme ultraviolet EUV radiation which radiates substantially into a radiation-collection direction. The radiation-collection direction is substantially different from the particle movement direction PMD. The likelihood that particles will enter the radiation collection system is therefore reduced. In an embodiment of a lithographic apparatus according to the present invention, the collection direction is a radial direction of the radiation-production system.

Figure 3:
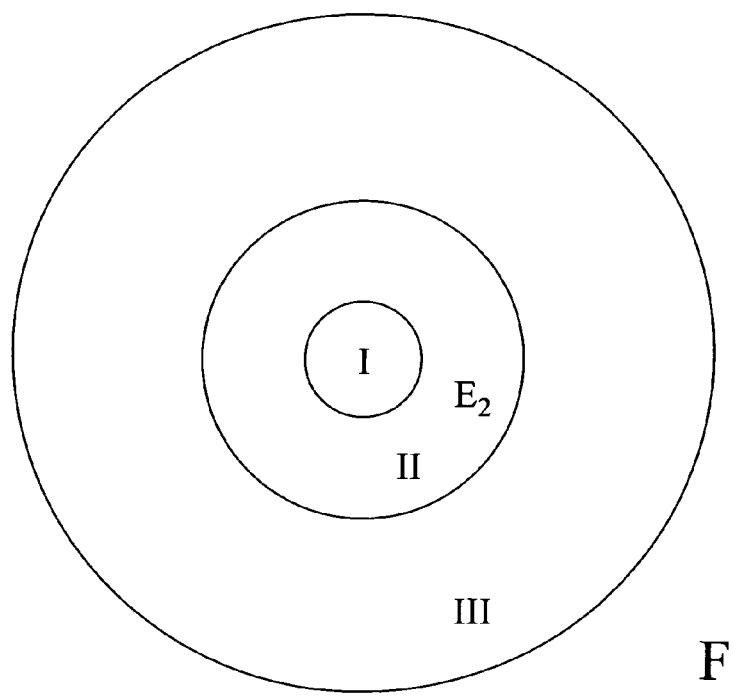
FIG. 3 depicts schematically a view along direction V in FIG. 2.

FIG. 3 shows schematically a view along direction V in FIG. 2. FIG. 3 shows three different zones. In zone I, both radiation and particles move towards the viewer looking into direction V. Zone II shows the ring-shaped electrode E2. Zone III is the zone in which substantially less particles move into a radial direction of the radiation-production system RPS, as compared to the number of particles moving into the axial direction, i.e., the particle movement direction PMD. Hence, arranging the radiation-collection system RCS such that the collection direction is a radial direction of the radiation-production system RPS results in a reduction of the number of particles entering the radiation collection system RCS, as compared to the number of particles entering the radiation collection system RCS in the known art.

Figure 4:
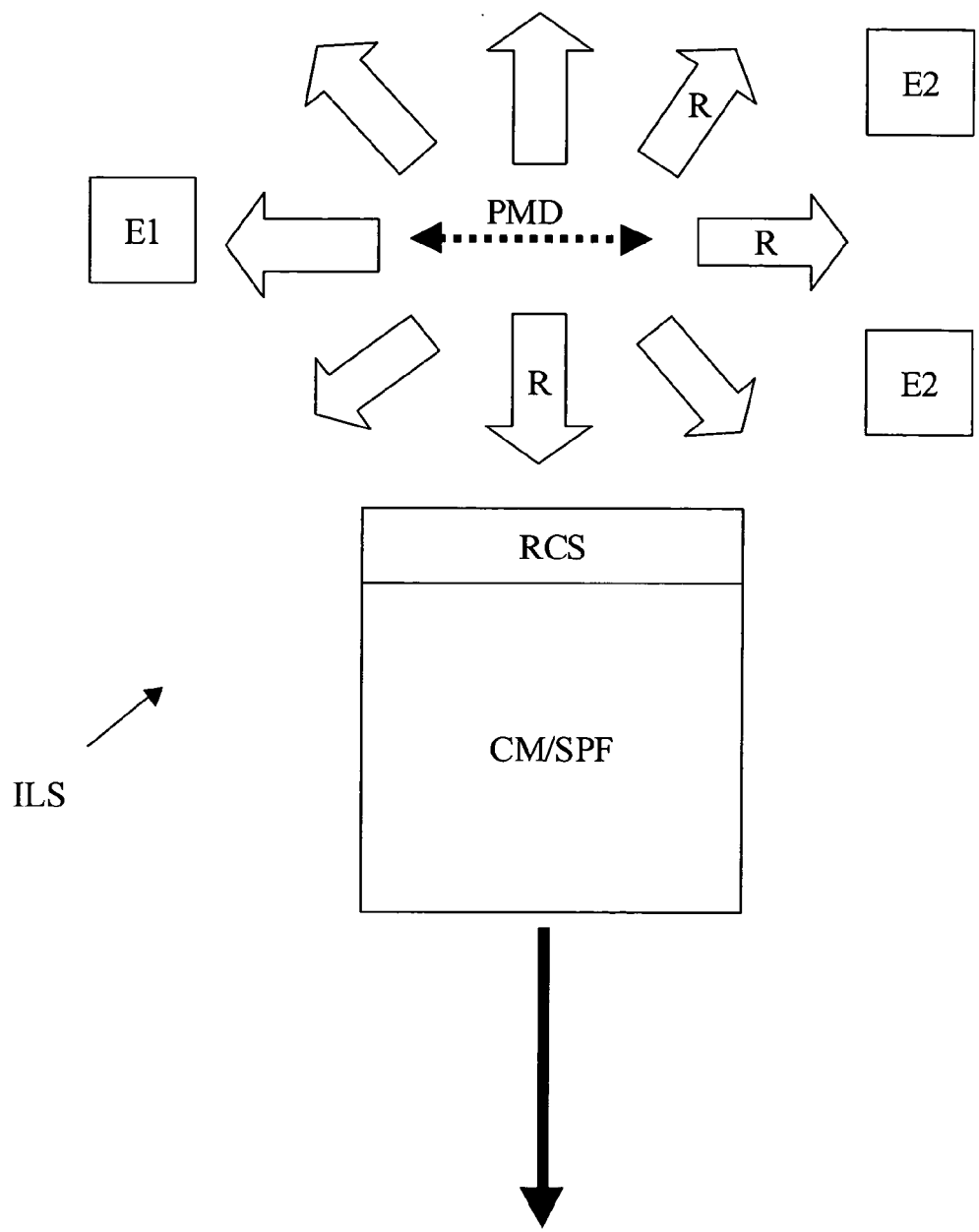
FIG. 4 depicts schematically an illumination system according to an embodiment of the invention.

It is possible, as shown in FIG. 4, that the radiation-collection system RCS has an optical axis substantially parallel to the radial direction. The radiation-collection system RCS may, as well known to those skilled in the art, comprise suitable collection mirrors CM and/or a spectral purity filter SPF to produce a radiation beam which is passed on to the illuminator IL shown in FIG. 1.

Figure 5:
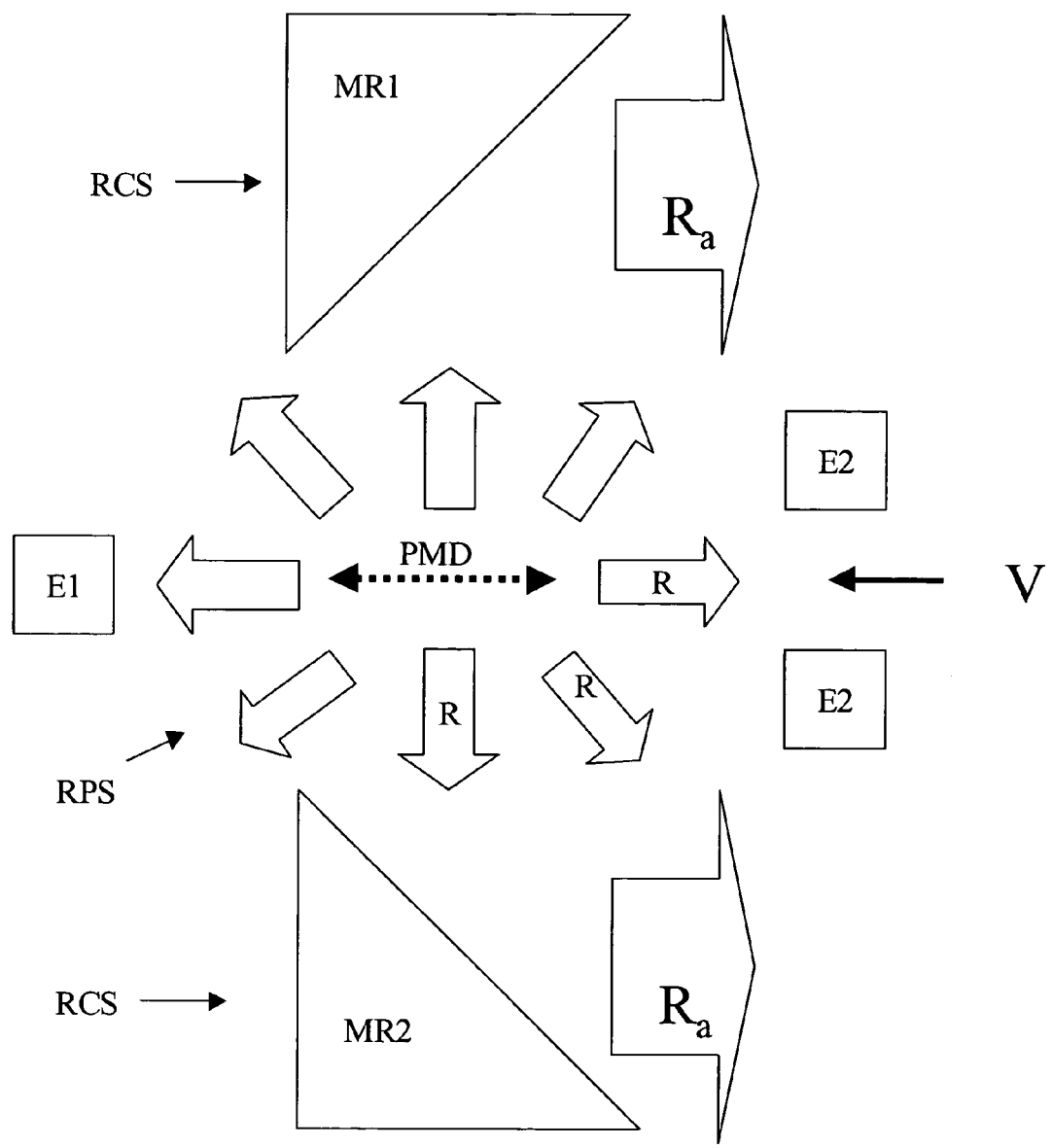
FIG. 5 depicts a radiation-production system and a radiator collection system according to an embodiment of the invention.

In an alternative embodiment of a lithographic apparatus according to the present invention, the radiation-collection system RCS has an optical axis substantially parallel to the axial direction of the radiation-production system RPS. In this embodiment, the radiation-collection system RCS comprises mirrors MR1, MR2 which are positioned such that the radiation collected by the radiation-collection system RCS is directed into the axial direction of the radiation-production system RPS. It is, of course, also possible that the radiation may be directed into an opposite direction as the direction shown in FIG. 5. The mirrors MR1, MR2 may each be part of one ring shaped mirror. The radiation collection system may further comprise an optical system (not shown) for aiding in providing the projecting beam of radiation. The optical system may be part of the illumination system, or may be regarded as the illuminator IL as shown in FIG. 1.

While specific embodiments of the invention have been described above, it will be appreciated that the invention may be practiced otherwise than as described. The description is not intended to limit the invention.

What is claimed is:

1. A lithographic apparatus comprising:
   an illumination system that provides a beam of radiation;
   a support structure that supports a patterning structure, the patterning structure configured to impart the beam of radiation with a pattern in its cross-section;
   a substrate support that supports a substrate; and
   a projection system that projects the patterned beam onto a target portion of the substrate,
   the illumination system comprising
      a radiation-production system that produces extreme ultra-violet radiation, wherein particles produced as a by-product of extreme ultra-violet radiation production move substantially in a particle-movement direction; and
      a radiation-collection system that collects the extreme ultra-violet radiation, the radiation-collection system being arranged to collect extreme ultra-violet radiation which radiates in a collection-direction, the collection-direction being substantially different from the particle-movement directions
   wherein the radiation-production system comprises two oppositely chargeable electrodes that generate an electric field therebetween, and the electric field substantially follows an axial direction of the radiation-production system.

2. A lithographic apparatus according to claim 1, wherein the collection-direction is a radial direction of the radiation-production system.

3. A lithographic apparatus according to claim 1, wherein at least one of the electrodes is substantially ring-shaped, and an axis of each ring-shaped electrode substantially coincides with the axial direction of the radiation-production system.

4. A lithographic apparatus according to claim 1, wherein the radiation-collection system has an optical axis substantially parallel to the axial direction of the radiation-production system.

5. A lithographic apparatus according to claim 1, wherein the radiation-collection system has an optical axis substantially parallel to the radial direction of the radiation-production system.

6. A lithographic apparatus according to claim 1, wherein the radiation-collection system comprises an optical system that provides the beam of radiation.

7. An illumination system for providing a beam of radiation, the illumination system comprising:
- a radiation-production system that produces extreme ultra-violet radiation, wherein particles produced as a by-product of extreme ultra-violet radiation production move substantially in a particle-movement direction; and
- a radiation-collection system that collects the extreme ultra-violet radiation, the radiation-collection system being arranged to collect extreme ultra-violet radiation which radiates in a collection-direction, the collection-direction being substantially different from the particle-movement direction,
- wherein the radiation-production system comprises two oppositely chargeable electrodes that generate an electric field therebetween, and the electric field substantially follows an axial direction of the radiation-production system.

8. An illumination system according to claim 7, wherein the collection-direction is a radial direction of the radiation-production system.

9. An illumination system according to claim 7, wherein at least one of the electrodes is substantially ring-shaped, and an axis of each ring-shaped electrode substantially coincides with the axial direction of the radiation-production system.

10. An illumination system according to claim 7, wherein the radiation-collection system has an optical axis substantially parallel to the axial direction of the radiation-production system.

11. An illumination system according to claim 7, wherein the radiation-collection system has an optical axis substantially parallel to the radial direction of the radiation-production system.

12. An illumination system according to claim 7, wherein the radiation-collection system comprises an optical system that provides the beam of radiation.

13. A method for providing a beam of radiation, comprising:
- producing extreme ultra-violet radiation and generating particles as a by-product of said production of extreme ultra-violet radiation, said particles moving substantially in a particle-movement direction;
- collecting extreme ultra-violet radiation that radiates in a collection direction, said collection direction being substantially different from said particle-movement direction; and
- generating an electric field along said particle-movement direction,
- wherein the electric field substantially follows an axial direction of the radiation-production system.

* * * * *